United States Patent
Iwami et al.

(10) Patent No.: US 8,032,807 B2
(45) Date of Patent: Oct. 4, 2011

(54) SCAN CONTROL METHOD, SCAN CONTROL CIRCUIT AND APPARATUS

(75) Inventors: Yoshikazu Iwami, Kawasaki (JP); Takayuki Kinoshita, Kawasaki (JP); Hidekazu Osano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 287 days.

(21) Appl. No.: 12/396,818

(22) Filed: Mar. 3, 2009

(65) Prior Publication Data
US 2009/0249143 A1 Oct. 1, 2009

(30) Foreign Application Priority Data
Mar. 28, 2008 (JP) ................. 2008-086845

(51) Int. Cl.
*G01R 31/28* (2006.01)
(52) U.S. Cl. ........................ 714/727; 714/729
(58) Field of Classification Search .............. 438/11; 716/114; 714/724, 726, 729, 727
See application file for complete search history.

(56) References Cited

U.S. PATENT DOCUMENTS

| | | | |
|---|---|---|---|
| 5,115,435 A | | 5/1992 | Langford, II et al. |
| 5,157,781 A | | 10/1992 | Harwood et al. |
| 6,049,901 A | * | 4/2000 | Stock et al. ............ 714/726 |
| 6,242,269 B1 | * | 6/2001 | Whetsel ............... 438/11 |
| 6,708,304 B1 | * | 3/2004 | Tsukimori et al. ...... 714/726 |
| 6,813,739 B1 | * | 11/2004 | Grannis, III ........... 714/729 |
| 7,013,415 B1 | | 3/2006 | Kamei et al. |
| 7,263,679 B2 | * | 8/2007 | Kuge et al. ............ 716/114 |
| 2003/0009715 A1 | | 1/2003 | Ricchetti et al. |
| 2003/0198185 A1 | | 10/2003 | Stancil |
| 2006/0200718 A1 | | 9/2006 | Halliday et al. |

FOREIGN PATENT DOCUMENTS

| | | |
|---|---|---|
| JP | 03-138578 | 6/1991 |
| JP | 09-218248 | 8/1997 |
| JP | 3966453 | 8/2007 |

OTHER PUBLICATIONS

European Search Report mailed Jul. 10, 2009 and issued in corresponding European Patent Application 09154439.5.

\* cited by examiner

*Primary Examiner* — David Ton
(74) *Attorney, Agent, or Firm* — Staas & Halsey LLP

(57) ABSTRACT

A scan control method for a circuit device connected with a first bus and having a test access port controller, including setting information indicating a register to be scanned in the circuit device, a number of scan shifts and a scan start via a second bus different from the first bus, and generating based on the information set, by using a sequencer, a signal replacing a test mode signal and a test reset signal transferred via the first bus during testing of the circuit device, and supplying the signal to the test access port controller.

15 Claims, 17 Drawing Sheets

FIG. 8

| state | sm_tms | sm_trst |
|---|---|---|
| start | 0 | 0 |
| idle | 0 | 0 |
| dr | 1 | 0 |
| ir0 | 1 | 0 |
| ir1 | 1 | 0 |
| capture | 0 | 0 |
| shift | 0 | 0 |
| exit1 | 1 | 0 |
| pause | 0 | 0 |
| exit2 | 1 | 0 |
| update | 1 | 0 |
| restart | 0 | 0 |
| trst | 0 | 1 |
| mrst | 1 | 0 |
| stop | 0 | 0 |

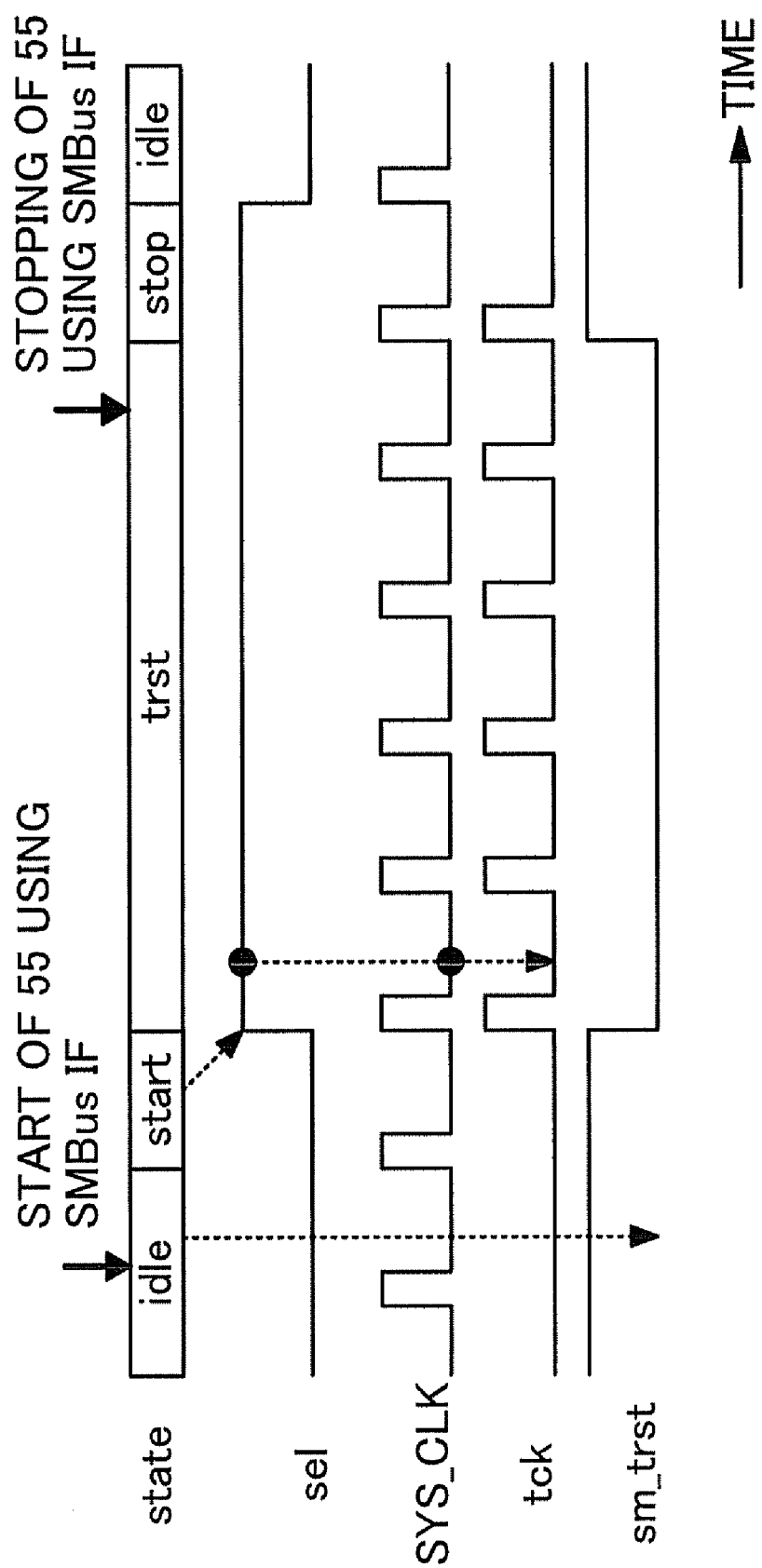

SCAN CONTROL METHOD, SCAN CONTROL CIRCUIT AND APPARATUS

CROSS-REFERENCE TO RELATED APPLICATIONS

This application claims the benefit of Japanese Patent Application No. 2008-86845, filed Mar. 28, 2008, the disclosure of which is incorporated herein by reference.

FIELD

An aspect of the present invention relates to a scan control method, scan control circuit and apparatus.

BACKGROUND

In apparatuses called a board, unit or module having mounted thereon a Large Scale Integrated circuit (LSI) or LSI chip, there is generally mounted a JTAG (Join Test Action Group) bus or JTAG interface connected to the LSI device. The JTAG bus is used for testing the LSI device or other purposes. The JTAG bus is a serial bus compliant with International Standard IEEE1149.1, and allows testing of the LSI device during a testing time period other than the apparatus operation time; the testing is performed in response to an access from an external tester or the like which gives boundary scan to the LSI device. The LSI device test may include a processing of specifying an alternating bit of Random Access Memory (RAM) in the LSI device.

Of devices used in the apparatuses, or some LSI device groups such as CPU (Central Processing Unit), some LSI devices are connected to an I2C (Inter-Integrated Circuit) bus or SMbus (System Management Bus). The I2C bus and SMBus are used at the time of controlling the apparatus during the apparatus operation. In this way, like an LSI device connected to JTAG bus and one connected to I2C bus and SMBus, LSI devices connected to buses of different types or standards may be used in a mixed manner in the same apparatus.

I2C bus and SMBus are a general-purpose communication bus used between devices. The I2C bus and SMBus are a two-wire serial bus basically having a clock signal line and data signal line; and a device connected to the serial bus has a unique address. Using this address, the devices communicate with each other via the I2C bus and SMBus.

For example, when LSI devices manufactured by different manufacturers are mounted in the same apparatus, so that the LSI devices are connected to buses of different types, the LSI devices connected to JTAG bus must be controlled via the JTAG bus, and the ones connected to I2C bus and SMBus must be controlled via the I2C bus and SMBus. Accordingly, bus controllers such as a JTAG bus controller and SMBus controller must be mounted correspondingly to the types of buses to which the LSI devices in the apparatus are connected.

FIG. 1 is a block diagram illustrating an example of board in which LSI devices connected to buses of different types are mounted in a mixed manner. The board 1 includes LSI devices 2, 3 and 4, and an SMBus controller 5 and JTAG controller 6. The SMBus controller 5 and LSI devices 2, 3 and 4 are connected to each other via an SMBus 7. The JTAG controller 6 and LSI device 4 are connected via a JTAG bus 8. The SMBus controller 5 is arranged exclusively for the SMBus 7, and can be connected to the outside of the board 1. The JTAG controller 6 is arranged exclusively for the JTAG bus 8, and can be connected to the outside of the board 1.

The method of scanning a circuit such as LSI device has been proposed by Patent Documents such as Japanese Patent Laid-Open No. 9-218248 and Japanese Patent Nos. 2940629 and 3966453.

When the board 1 is controlled via two types of buses, that is, the SMBus 7 and JTAG bus 8, the controllers 5 and 6 each exclusively used for the buses 7 and 8 must be mounted on the board 1, thus raising the cost of the board 1.

Further, when two types of controllers 5 and 6 are arranged to control the board 1, two types of control programs for the board 1 must be prepared, and the control operations by the two types of control programs must be synchronized. Consequently, the control of the whole board 1 becomes complex and difficult to perform.

Thus, an object of one aspect of the present invention is to allow control of a whole apparatus by a simpler control operation while using a less expensive apparatus configuration.

SUMMARY

According to an aspect of the invention, a scan control method for a circuit device connected with a first bus and having a test access port controller includes setting information indicating a register to be scanned in the circuit device, a number of scan shifts and a scan start via a second bus different from the first bus, and generating based on the information set, a signal replacing a test mode signal and a test reset signal transferred via the first bus during testing of the circuit device, and supplying the signal to the test access port controller.

Additional aspects and/or advantages will be set forth in part in the description which follows and, in part, will be apparent from the description, or may be learned by practice of the invention.

BRIEF DESCRIPTION OF DRAWINGS

These and/or other aspects and advantages will become apparent and more readily appreciated from the following description of the embodiments, taken in conjunction with the accompanying drawings of which:

FIG. 8 is a view illustrating a relationship between an operating state of TAPC, a test mode select signal and a test reset signal;

FIG. 12 is a timing chart describing an operation of a sequencer in a test reset mode;

DESCRIPTION OF EMBODIMENTS

Figure 1:
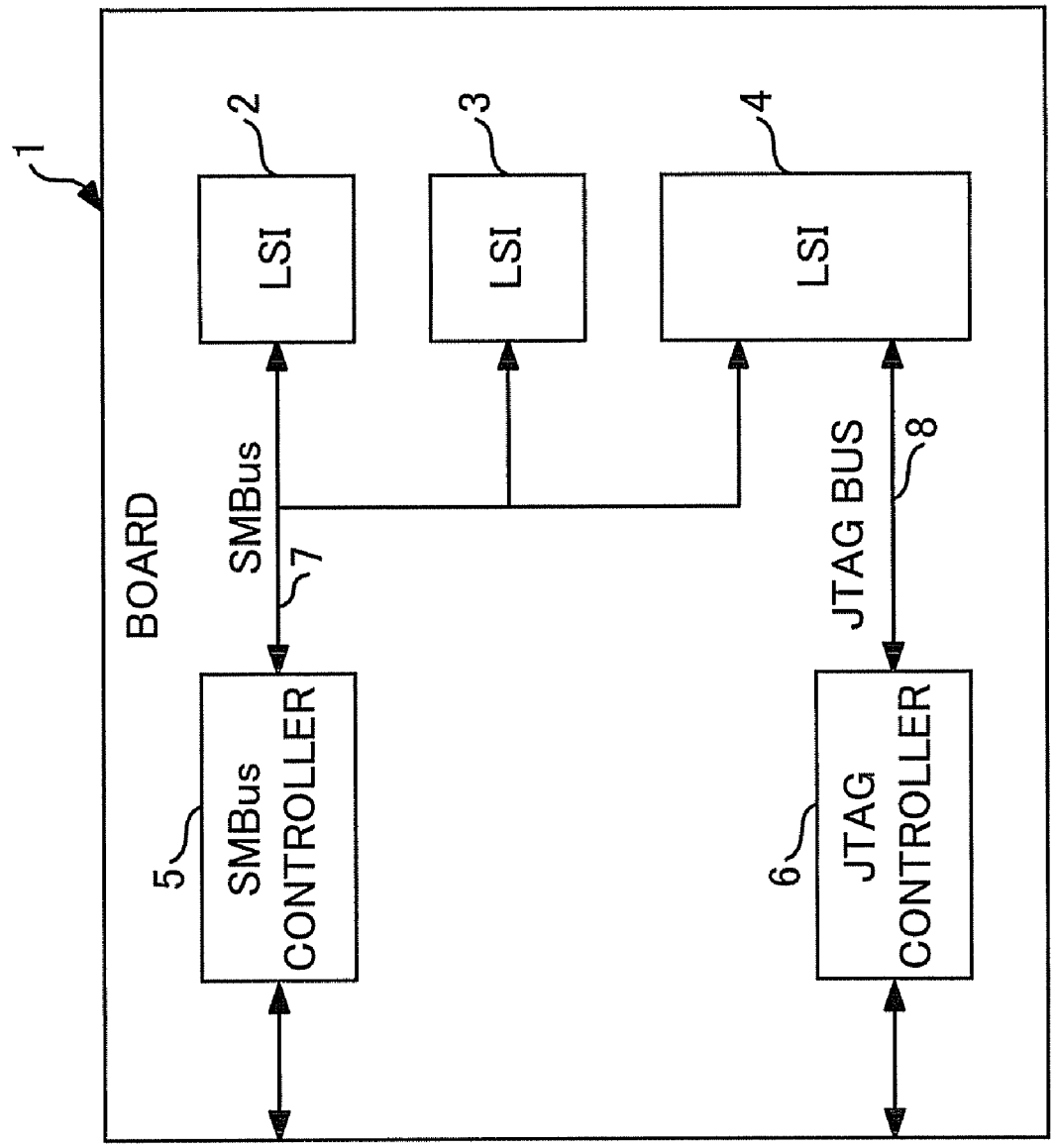
FIG. 1 is a block diagram illustrating an example of board in which LSI devices connected to buses of different types are mounted.

Reference will now be made in detail to the embodiments, examples of which are illustrated in the accompanying drawings, wherein like reference numerals refer to the like elements throughout. The embodiments are described below to explain the present invention by referring to the figures.

In a scan control method, scan control circuit and apparatus according to one aspect of the present invention, a circuit device is connected with a first bus, and includes a test access port controller. The scan control circuit includes a register unit in which information indicating a register to be scanned in the circuit device, a number of scan shifts and a start of scanning can be set via a second bus different from the first bus; a sequencer which generates based on the information set in the register unit, a signal replacing a test mode signal and a test reset signal transferred via the first bus during testing of the circuit device, and supplies the signal to the test access port controller.

The first bus is not required to be used during operation of the apparatus, and the second bus arranged for controlling the apparatus is used to perform scanning during testing of the apparatus, so there is no need to mount a JTAG controller exclusively used for the first bus on the apparatus. Further, there is no need to install on the apparatus, two control programs used in the bus controller for the first bus and the bus controller for the second bus. Further, only the second bus is used to control the whole apparatus.

Figure 2:
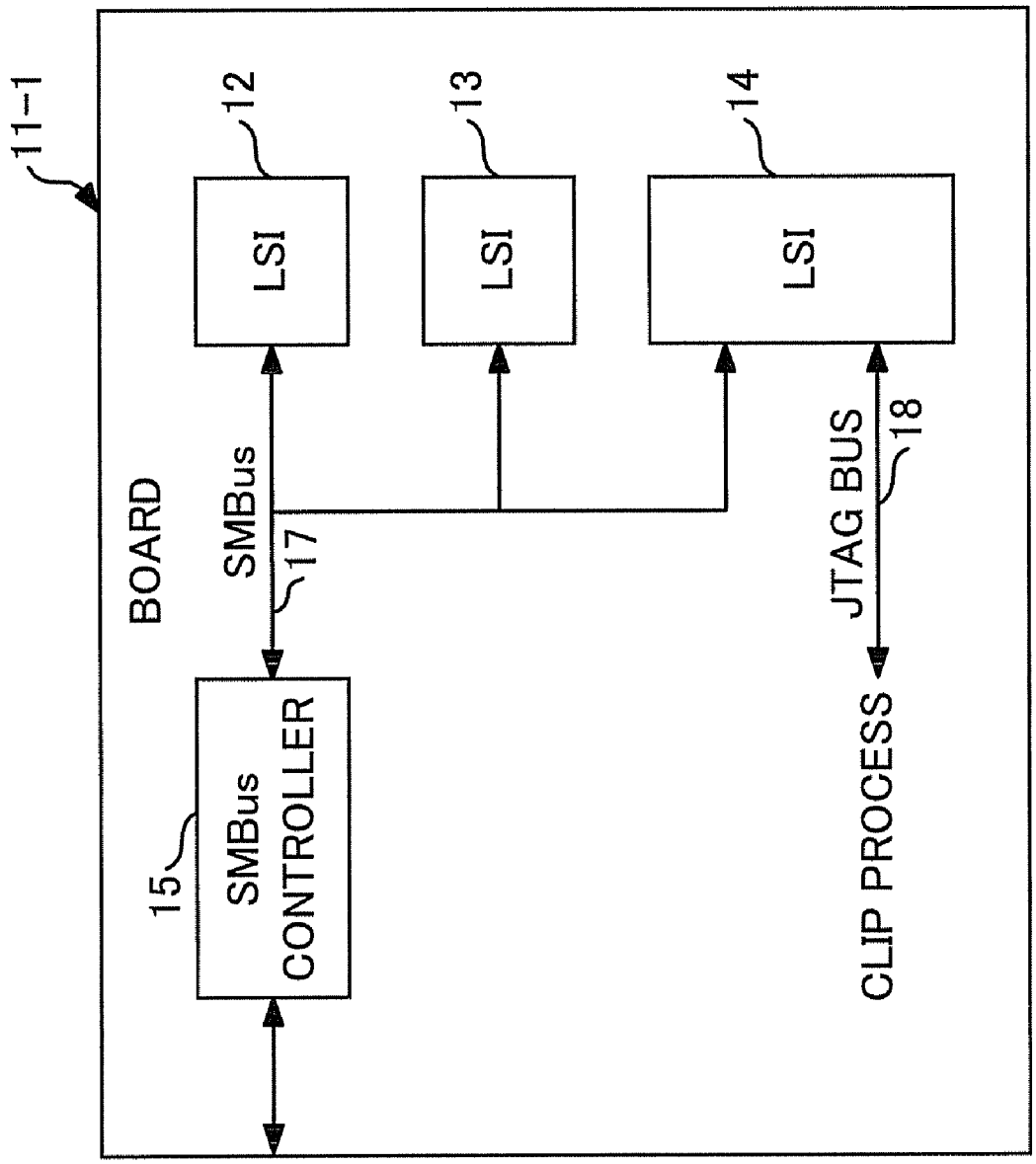
FIG. 2 is a block diagram illustrating a configuration of a board according to an embodiment of the present invention.

FIG. 2 is a block diagram illustrating a configuration of a board according to an embodiment of the present invention. Multiple LSI devices 12, 13 and 14, and an SMBus controller 15 are mounted on a board 11-1. The SMBus controller 15 and LSI devices 12, 13 and 14 are connected to each other via an SMBus or SMBus interface 17. A JTAG bus or JTAG interface 18 is connected to the LSI device 14. The SMBus 17 and JTAG bus 18 are both connected to the LSI device 14.

The SMBus controller 15 is arranged exclusively for the SMBus 17, and may be connected to a component outside of the board 11-1. The JTAG bus 18 may be connected directly to the outside component of the board 11-1 by connecting a clip directly to a terminal or the like on the board 11-1. When an I2C bus is used instead of the SMBus 17, an I2C bus controller is used instead of the SMBus controller 15.

The LSI device 14 includes a scan control circuit to be described later, and an internal setting of the LSI device 14 may be made via the SMBus 17 by using a scan function. The scan control circuit implements an element for controlling the scan function via an interface such as the SMBus 17. The JTAG bus 18 is used as a unit to meet test requirement(s), and is not used during operation of the board 11-1. The system control interface used during operation of the board 11-1 is made only via the SMBus 17. The control of scan function via the JTAG bus 18 is mainly the control of Test Access Port Controller (TAPC) arranged, as described later, in the LSI device 14, and TAPC is controlled not via the JTAG bus 18 but via the SMBus 17, whereby the scan function is implemented.

Figure 3:
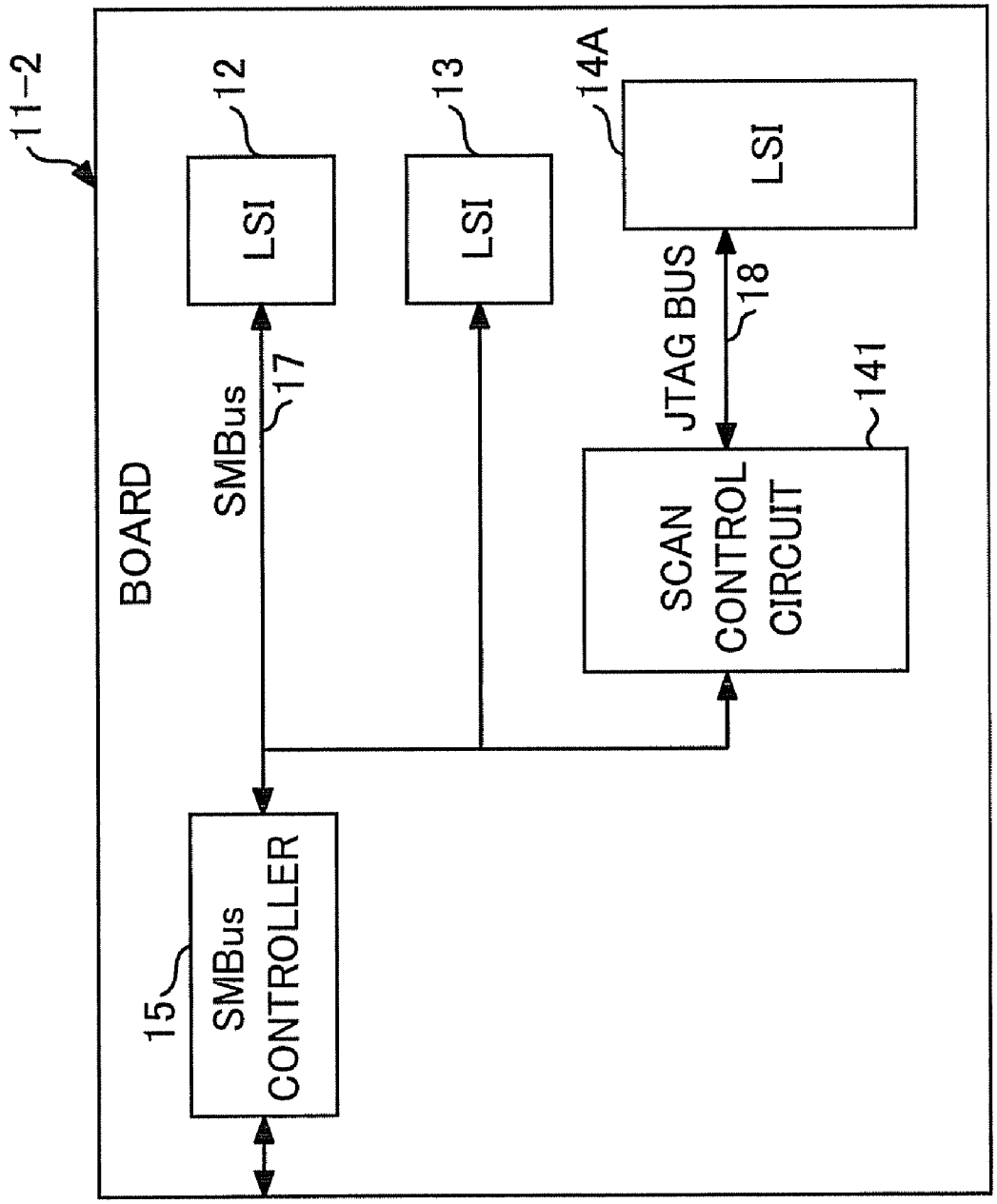
FIG. 3 is a block diagram illustrating a configuration of a board according to an embodiment of the present invention.

FIG. 3 is a block diagram illustrating a configuration of a board according to an embodiment of the present invention.

In FIG. 3, the same reference numerals are applied to parts corresponding to those of FIG. 2, and an explanation thereof is omitted. In a board 11-2 illustrated in FIG. 3, an LSI device 14A does not include a scan control circuit, and a scan control circuit 141 is arranged separately from the LSI device 14A. The SMBus 17 is connected via the scan control circuit 141 and JTAG bus 18 to the LSI device 14A. The LSI device 14A is connected to the JTAG bus 18, but not connected directly to the SMBus 17. The SMBus 17 is connected to the scan control circuit 141.

Figure 4:
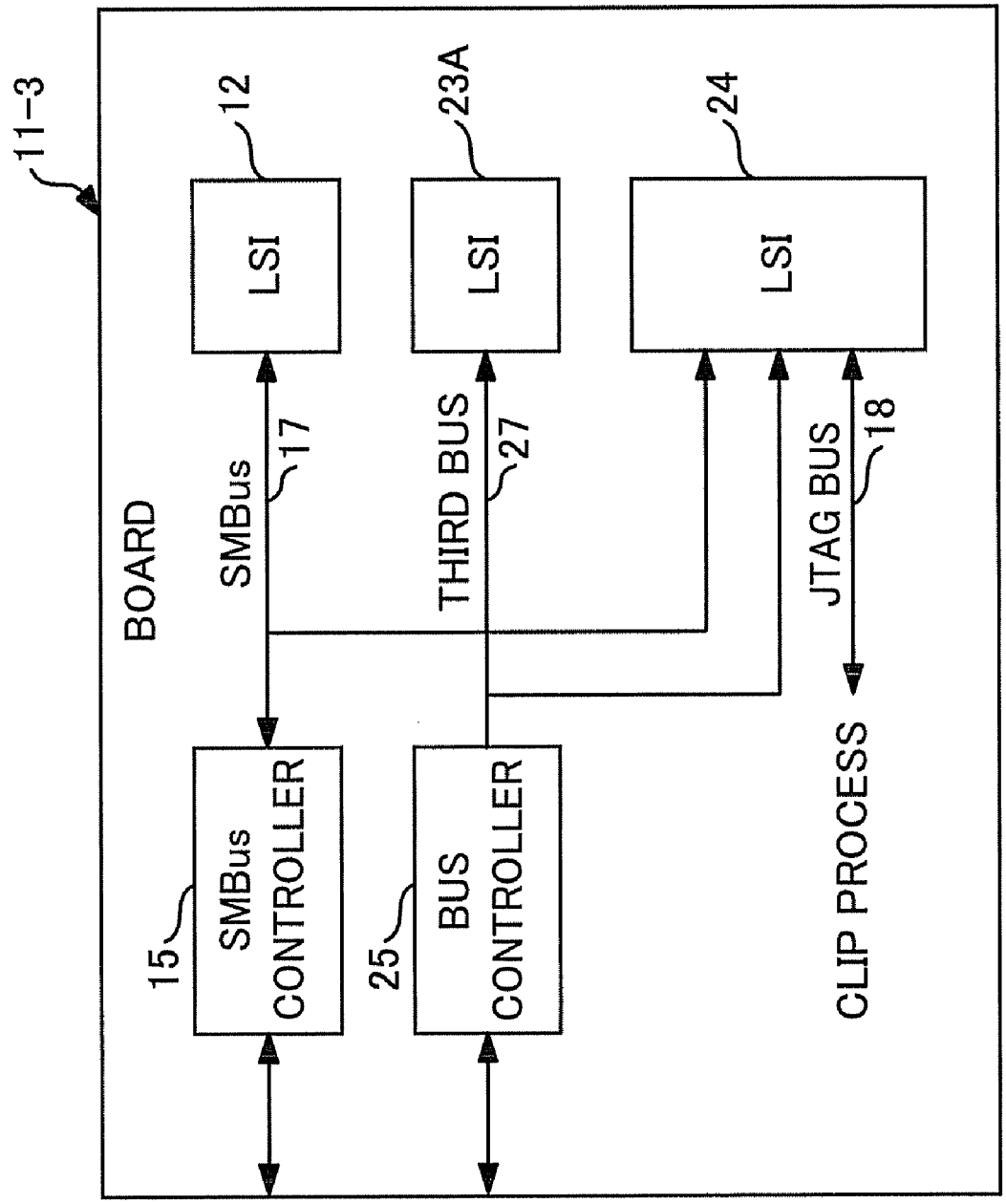
FIG. 4 is a block diagram illustrating a configuration of a board according to an embodiment of the present invention.

FIG. 4 is a block diagram illustrating a board according to an embodiment of the present invention. In FIG. 4, the same reference numerals are applied to parts corresponding to those of FIG. 2, and an explanation thereof is omitted. Three buses 17, 18 and 27 of different types and standards are mounted on a board 11-3 illustrated in FIG. 4. For the convenience of explanation, assume that the first bus is the SMBus 17, the second bus is the JTAG bus 18, and the third bus is, for example, an I2C bus. Thus, an I2C bus controller is arranged as a third bus controller 25.

The I2C bus controller 25 is arranged for the I2C bus 27, and can be connected to a component the outside of the board 11-3. The I2C bus controller 25 is connected to the LSI device 23A and LSI 24 via the I2C bus 27. The LSI 24 is connected to the SMBus 17, JTAG bus 18 and I2C bus 27.

The LSI device 24 includes a scan control circuit to be described later, so the internal setting of the LSI device 24 can be made via the SMBus 17 or I2C bus 27 by using the scan function. The scan control circuit implements control of the scan function via an interface such as the SMBus 17 or I2C bus 27. Further, the LSI device 24 includes a selector circuit (not illustrated) which, when the internal setting of the LSI device 24 is made via the SMBus 17 by using the scan function, connects the scan control circuit to the SMBus 17, and when the internal setting of the LSI device 24 is made via the I2C bus 27 by using the scan function, connects the scan control circuit to the I2C bus 27.

The JTAG bus 18 is used as a unit to meet test requirement(s), and is not used during operation of the board 11-3. System control interfaces used during operation of the board 11-3 are the SMBus 17 and I2C bus 27. The control of scan function via the JTAG bus 18 is mainly the control of TAPC arranged, as described later, in the LSI device 24. TAPC is controlled not via the JTAG bus 18 but via the SMBus 17 or I2C bus 27, and the scan function is implemented. The number of buses other than the JTAG bus 18 is not limited to two, and the buses are not limited to an SMBus and I2C bus. Three or more types of buses may be arranged.

Figure 5:
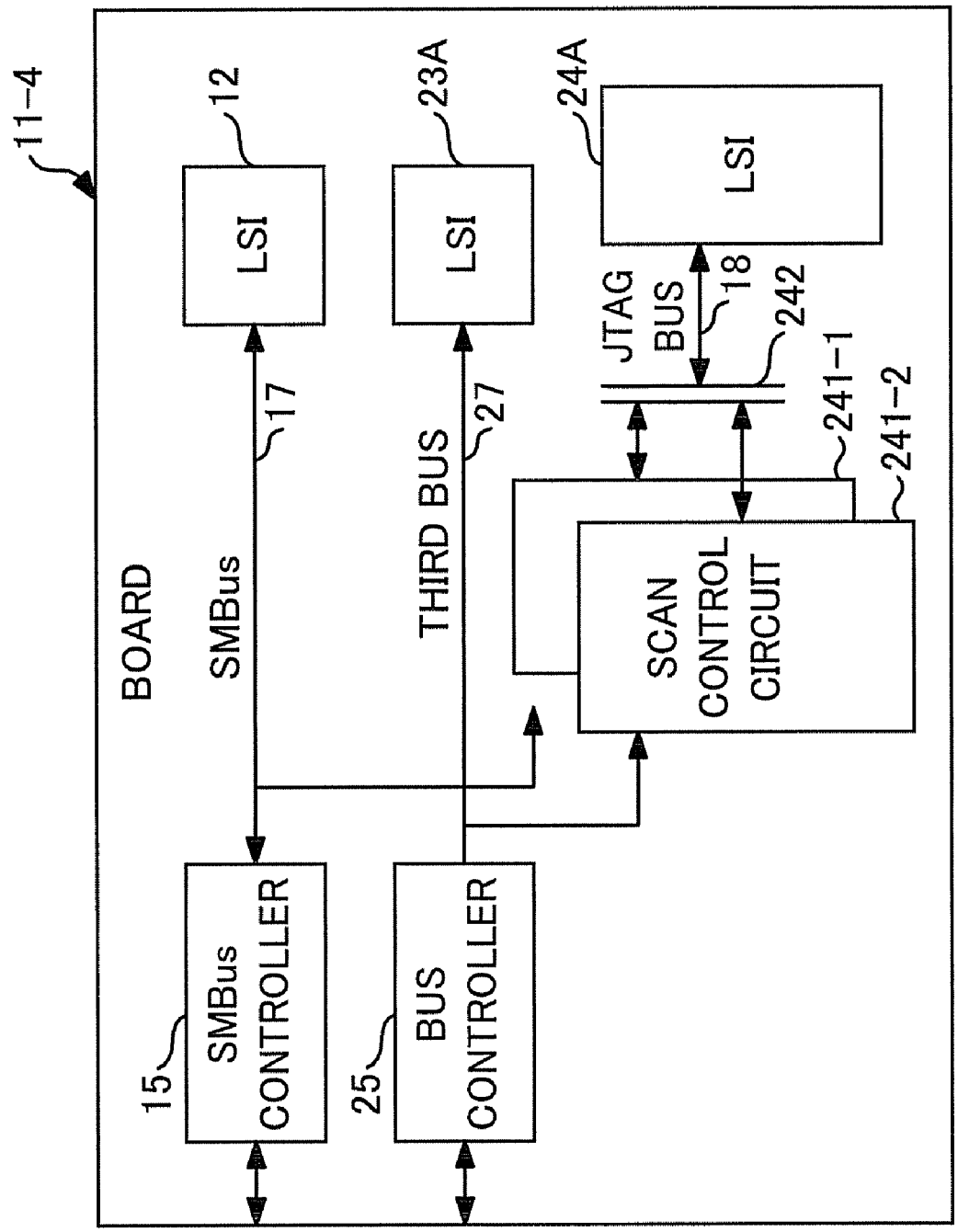
FIG. 5 is a block diagram illustrating a configuration of a board according to an embodiment of the present invention.

FIG. 5 is a block diagram illustrating a board according to an embodiment of the present invention. In FIG. 5, the same reference numerals are applied to parts corresponding to those of FIG. 2, and an explanation thereof is omitted. In a board 11-4 illustrated in FIG. 5, the LSI device 24A does not include a scan control circuit. Scan control circuits 241-1 and 241-2 arranged separately from the LSI device 24A and a selector circuit 242 are provided on the board 11-4. The SMBus 17 is connected to the LSI device 24A via the scan control circuit 241-1, a selector circuit 242 and the JTAG bus 18. The I2C bus 27 is connected to the LSI device 24A via the scan control circuit 241-2, the selector circuit 242 and the JTAG bus 18. The LSI device 24A is connected to the JTAG bus 18, but not connected directly to the SMBus 17 and I2C bus 27. The SMBus 17 is connected to the scan control circuit 241-1, and the I2C bus 27 is connected to the scan control circuit 241-2. When the internal setting of the LSI device 24A is made via the SMBus 17 by using the scan function, the selector circuit 242 connects the scan control circuit 241-1 to the LSI 24A. When the internal setting of the LSI device 24A is made via the I2C bus 27 by using the scan function, the selector circuit 242 connects the scan control circuit 241-2 to the LSI 24A.

The scan control circuits 241-1 and 241-2 and the selector circuit 242 may be constructed using a single LSI device.

According to the above embodiments, the buses used as control interfaces during operation of the board are, for e.g., SMBus and/or I2C bus, but the present invention is not limited thereto. Further, the bus not used during operation of the board and the apparatus used as a unit that meets test requirements is a JTAG bus, but the present invention is not limited thereto.

Figure 6:
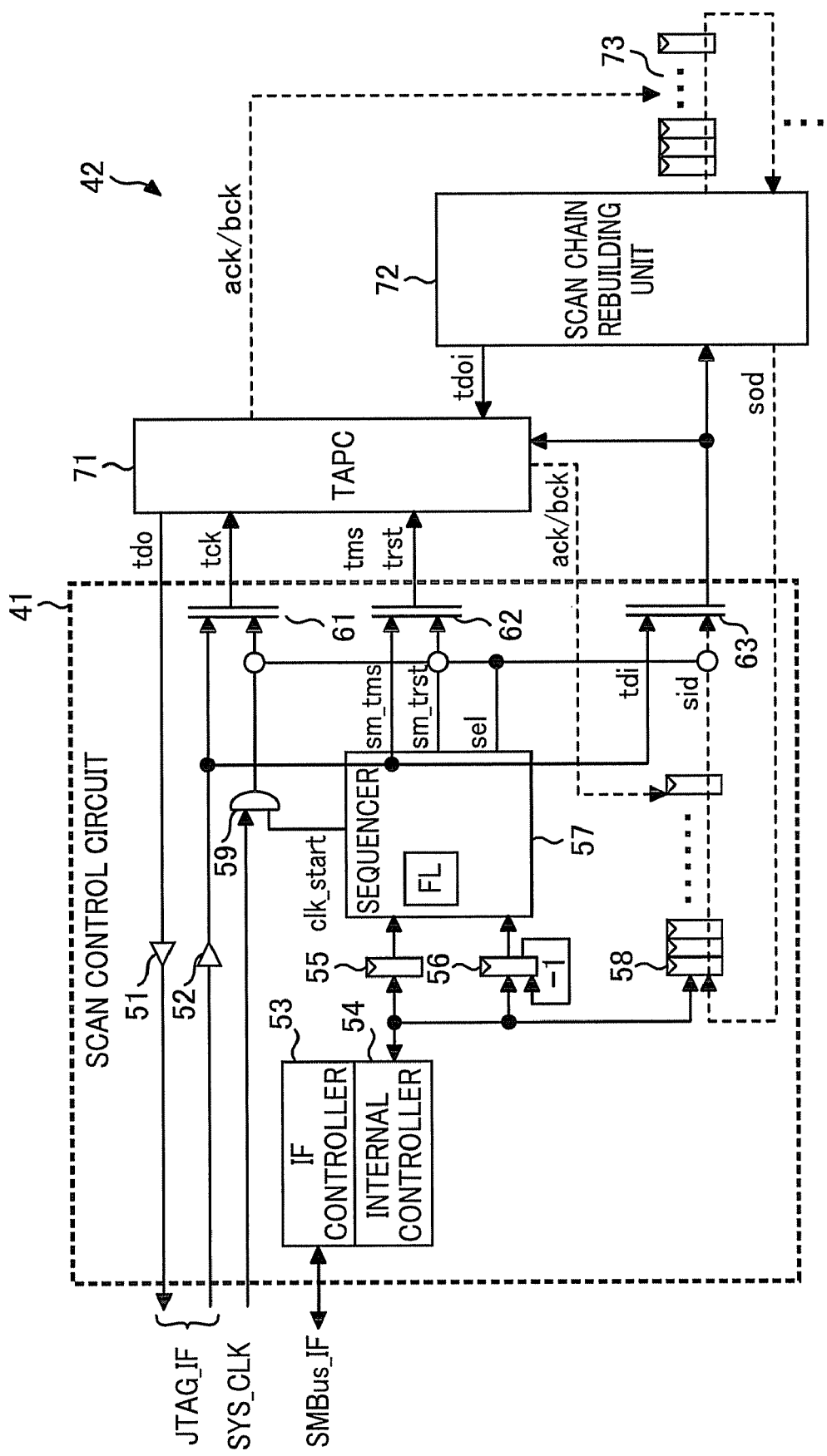
FIG. 6 is a circuit diagram illustrating a scan control circuit.

The scan control circuit of the embodiment will be described. FIG. 6 is a circuit diagram illustrating the scan control circuit of an embodiment. For the convenience of explanation, assume that the bus used as the system control interface is SMBus and the bus used as a unit that meets test requirements is JTAG bus. Consequently, a scan control circuit 41 illustrated in FIG. 6 is included in the LSI device 14 of FIG. 2, or corresponds to the scan control circuit 141 of FIG. 3, or is included in the LSI device 24 of FIG. 4, or corresponds to the scan control circuit 241-1 of FIG. 5. A circuit unit 42 illustrated in FIG. 6 is a circuit arranged in the LSI devices 14, 14A, 24 and 24A.

Referring to FIG. 6, JTAG_IF denotes a signal transferred via the JTAG bus or JTAG interface 18. JTAG_IF includes TCK, TMS, TRST, TDI and TDO. TCK denotes a test clock inputted to the scan control circuit 41. TMS denotes a test mode signal indicating a test mode inputted the scan control circuit 41. TAPC to be described later operates in response to test mode signal TMS in synchronization with test clock TCK. TRST denotes a test reset signal inputted to the scan control circuit 41. TDI denotes a test data signal inputted to the scan control circuit 41. TDO denotes a test data signal outputted from the scan control circuit 41. SYS_CLK denotes a system control clock used in the apparatus such as board. SMBus_IF denotes a clock or serial data transferred via the SMBus 17, and includes SMBCLK and SMBDT. SMBCLK denotes an SMBus clock. SMBDT denotes serial data transferred in two ways.

The scan control circuit 41 includes buffers 51 and 52 connected as illustrated in FIG. 6, an interface (IF) controller 53, an internal controller 54, registers 55 and 56, a sequencer 57, a data register 58, AND circuit 59 and selectors 61, 62 and 63. The circuit unit 42 includes a TAPC 71 connected as illustrated in FIG. 6, a scan chain rebuilding unit 72 and a scan register unit 73. The scan register unit 73 includes multiple flip-flops (FF) and forms multiple scan chains. The scan chain rebuilding unit 72 rebuilds, as required, a combination of multiple scan chains formed by the scan register unit 73. As the circuit unit 42, a circuit of an existing configuration can be used.

The scan control circuit 41 may be mounted in the LSI device, or mounted outside (separate of and independent) the LSI device. However, since the TAPC 71 and the scan chain rebuilding unit 72 are used in testing the interior of the LSI device, they are mounted in the LSI device. In the scan control circuit 41, an interface equivalent to JTAG bus is formed by the sequencer 57, so when mounted outside the LSI device, the scan control circuit 41 can be connected to the JTAG bus 18.

Referring to FIG. 6, sm_tms denotes a test mode select signal generated by the sequencer 57. The test mode select signal is a signal similar to TMS. sm_trst denotes a test reset signal generated by the sequencer 57. Signal sel denotes a select signal generated by the sequencer 57, for selecting one of JTAG_IF and SMBus_IF. Signal clk_start denotes a clock start signal generated by the sequencer 57. Clock start signal clk_start is a signal for supplying system clock SYS_CLK from the AND circuit 59 when scanning (hereinafter referred to as "SMBus scan") is performed according to the control from the SMBus 17. Signal tck denotes a test clock outputted from the selector 61 as a result of selecting one of test clock TCK and system clock SYS_CLK. Signal tms denotes a selected test mode select signal outputted from the selector 62 as a result of selecting test mode select signal sm_tms. Signal trst denotes a selected test reset signal outputted from the selector 62 as a result of selecting test rest signal sm_trst. Signal tdo denotes a test data signal inputted from the TAPC 71 and outputted as test data TDO from the scan control circuit 41. Signal tdi denotes a test data signal inputted as test data TDI from the JTAG bus 18 and inputted from the scan control circuit 41 to the TAPC 71. Signal tdoi denotes scan-out data outputted from the scan chain rebuilding unit 72 to the TAPC 71 at the time of JTAG_IF scan. The TAPC 71 outputs test data tdo based on scan-out data tdoi. Signal ack/bck denotes a scan clock supplied from the TAPC 71 to the scan register unit 73 used for the scan chain rebuilding unit 72 to perform scanning, that is, supplied to the multiple flip-flops constituting the scan register unit 73. Scan clock ack/bck is also supplied from the TAPC 71 to the data register 58. Signal sod denotes scan-out data outputted from the scan chain rebuilding unit 72 to the data register 58 at the time of SMBus scan. Signal sid denotes scan-in data outputted from the data register 58 and inputted via the selector 63 to the scan chain rebuilding unit 72 at the time of SMBus scan.

Select signal sel generated by the sequencer 57 is supplied to each of the selectors 61, 62 and 63 to specify an input signal to be selected and outputted from the selectors 61, 62 and 63. Referring to FIG. 6, the white circle mark indicates an input signal selected and outputted from the selectors 61, 62 and 63 when select signal sel of an active signal level (for example, a high level) is supplied to the selectors 61, 62 and 63.

Referring to FIG. 6, when the clock signal and serial data SMBus_IF are supplied via the SMBus 17 to the IF controller 53, the command register mode or internal chain (data register) mode (hereinafter referred to as "IR/DR mode") and the start bit are written by Register Write operation from the internal controller 54 into the register 55, and a number of scan shifts into the register 56. The start bit is turned on using the SMBus 17 when scanning is started. In the IR mode, scanning of Instruction Register in the LSI device having the circuit unit 42 is specified; in the DR mode, scanning of Data Register in the LSI device having the circuit unit 42 is specified. The register write operation for the registers 55 and 56 triggers the start of operation of the sequencer 57.

The sequencer 57 generates a sequence needed for causing the scan function of the TAPC 71 to work, based on the IR/DR mode, start bit and the number of shifts written in the registers 55 and 56, and controls the TAPC 71 by using test mode select signal sm_tms and test reset signal sm_trst. The TAPC 71 starts scanning based on test mode select signal sm_tms and test reset signal sm_trst. Also, the sequencer 57 manages scan flag FL which is turned on during scanning based on the control from the SMBus 17.

The scan chain rebuilding unit 72 cuts an output of scan-out data tdoi to the TAPC 71 and an input of test data tdi from the scan control circuit 41, that is, cuts an input of the scan-in data, so that connection with the data register 58 is made. As a result, the scan register unit 73 and data register 58 form one scan chain, thus accomplishing scan-in and scan-out.

Figure 7:
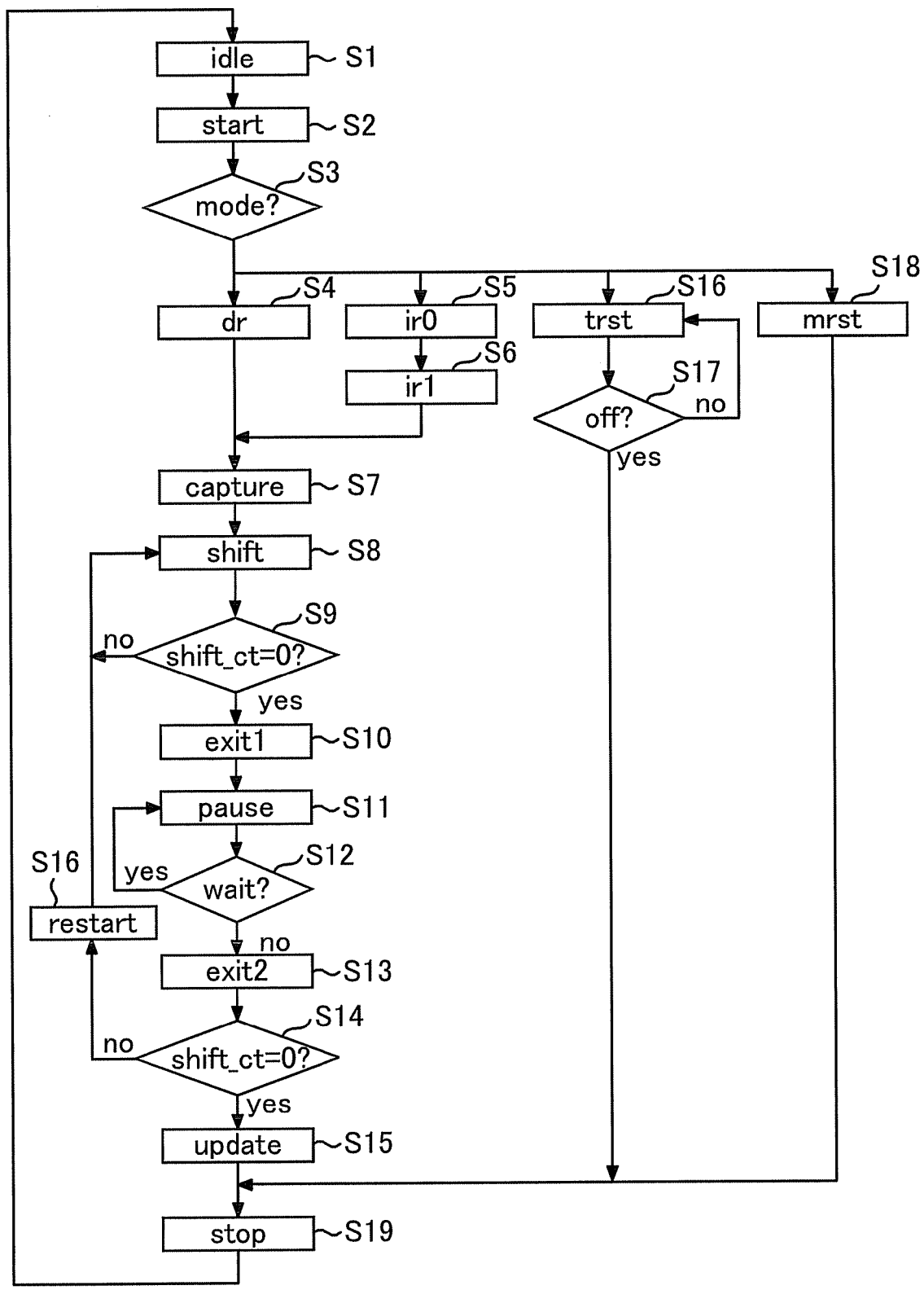
FIG. 7 is a flowchart describing an operation of Test Access Port Controller (TAPC)

FIG. 7 is a flowchart for describing the operation of the TAPC 71, and corresponds to a State Diagram. FIG. 8 is a view illustrating a relationship between an operating state "state" of the TAPC 71, test mode select signal sm_tms and test reset signal sm_trst.

In operating state start, idle, dr, ir0, ir1, capture, shift, exit1, pause, exit2, update, restart, trst, mrst and stop illustrated in FIG. 7, test mode select signal sm_tms and test reset signal sm_trst each having a logical value illustrated in FIG. 8 are generated. For example, logical value "0" indicates an inactive signal level (for example, low level) and logical value "1" indicates an active signal level (for example, high level).

Referring to FIG. 7, in operation S1, an operating state "state" of the TAPC 71 is set to idle state "idle". In operation S2, the operating state is set to start state "start". In operation S3, a mode including whether the mode "mode" is dr, ir0, trst or mrst is determined. If operating mode "mode" is DR mode dr being set in operation S4, the data register is scanned. If operating mode "mode" is IR mode ir0, ir1 being set in operation S5, S6, the command register is scanned.

Figure 9:
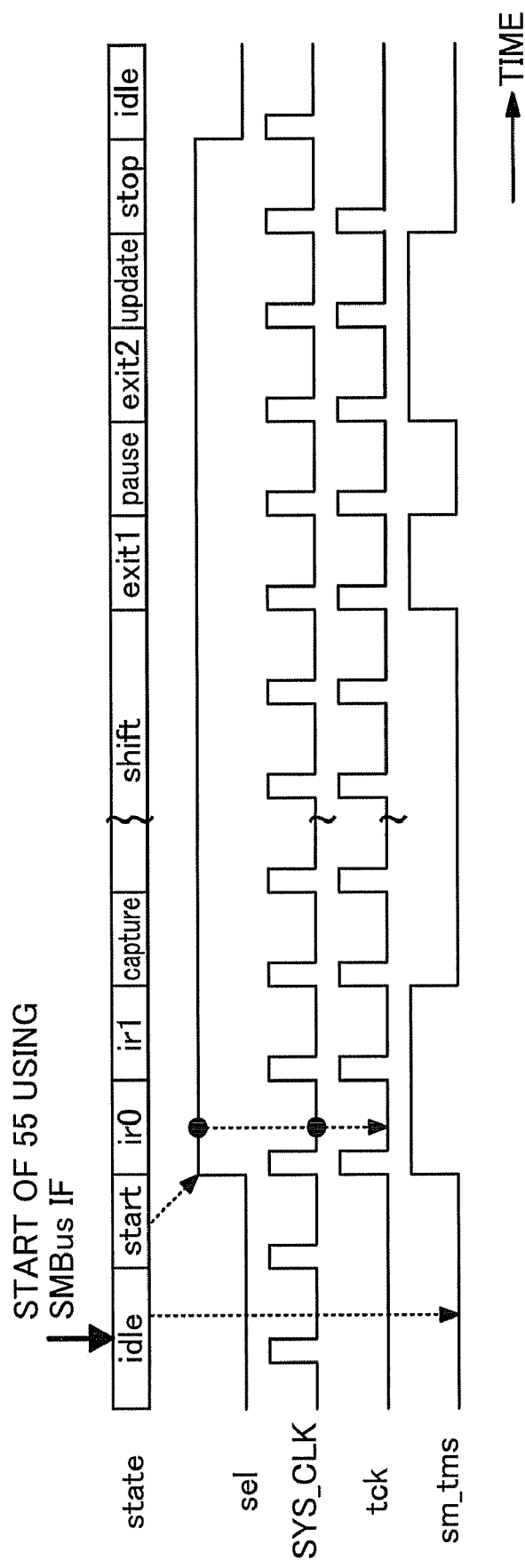
FIG. 9 is a timing chart describing an operation of a sequencer in an IR mode.
Figure 10:
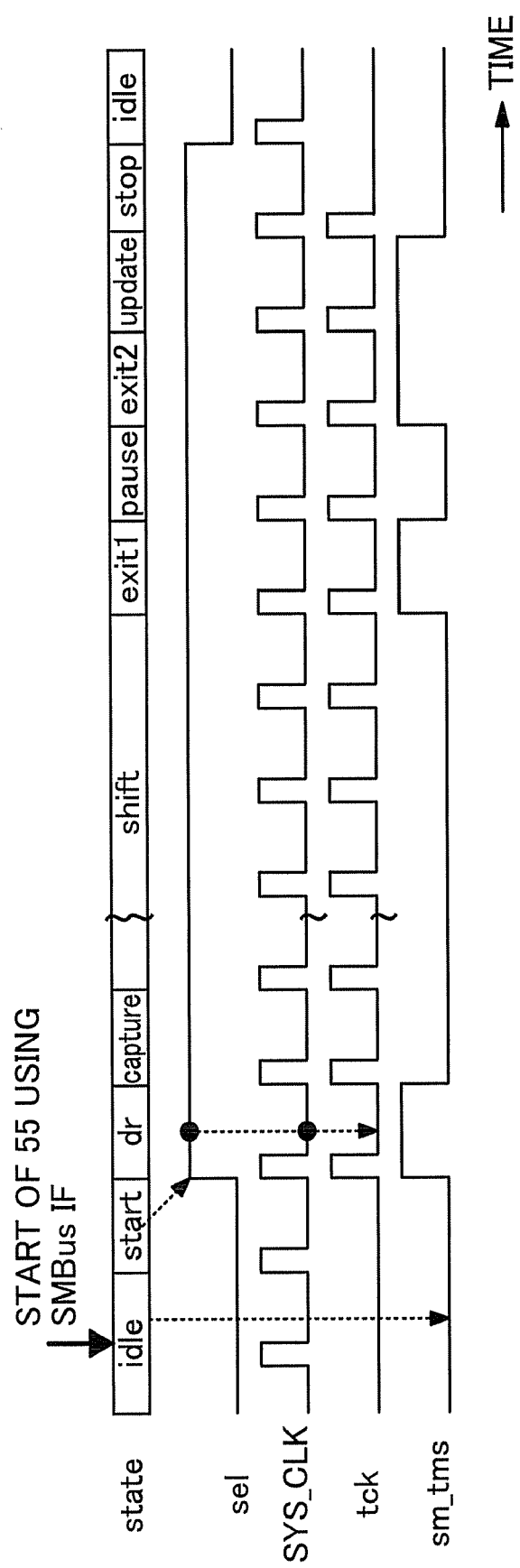
FIG. 10 is a timing chart describing an operation of a sequencer in a DR mode.

FIG. 9 is a timing chart describing an operation of the sequencer 57 in the IR mode. FIG. 10 is a timing chart describing an operation of the sequencer 57 in the DR mode. FIGS. 9 and 10, and FIGS. 11 to 13 illustrate an operating state "state" of the TAPC 71, select signal sel, system clock SYS_CLK, test clock tck and test mode select signal sm_tms. In FIGS. 9 and 10, the downward thick arrow indicates the start of the register 55 by using the clock and serial data SMBus_IF from the SMBus 17.

In capture mode "capture" set in operation S7, a scanned command or scan data of the data register is loaded in a specified scan chain of the scan register unit 73. In shift mode "shift" set in operation S8, a shift operation of shifting the command or register data loaded in the scan chain is performed. In operation S9, whether or not the count shift_ct of the number of shifts is zero or not is determined. If the result of determination is NO, the operation returns to operation S8. If the result of determination is YES in operation S9, the operation proceeds to operation S10.

In exit mode "exit1" set in operation S10, the shift operation is stopped. In pause mode "pause" set in operation S11, the shift operation is temporarily stopped and the operation enters the wait state. In operation S12, whether or not prescribed time "wait" has elapsed is determined. If it is determined YES in operation S12, the operation returns to S11. If it is determined NO in operation S12, the operation proceeds to operation S13.

In exit mode "exit2" set in operation S13, the shift operation is stopped. In operation S14, whether or not the count shift_ct of the number of shifts is zero is determined. If it is determined YES in operation S14, the operation proceeds to operation S15. If it is determined NO in operation S14, the operation proceeds to operation S16. In update mode "update" set in operation S15, the shift operation is completed and a shift to scanning of the subsequent command register is made, or alternatively, the data register is updated and the operation proceeds to operation S19 to be described later. In restart mode "restart" set in operation S16, the shift operation is restarted and the operation proceeds to operation S8.

Figure 11A:
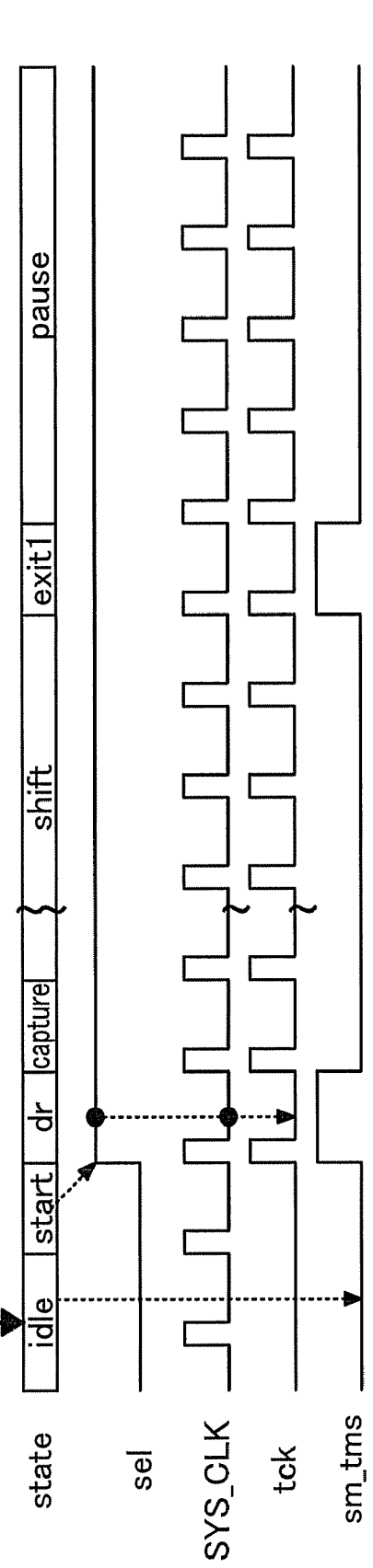
FIGS. 11A and 11B are timing charts describing operation (s) of a sequencer in a restart mode.
Figure 11B:
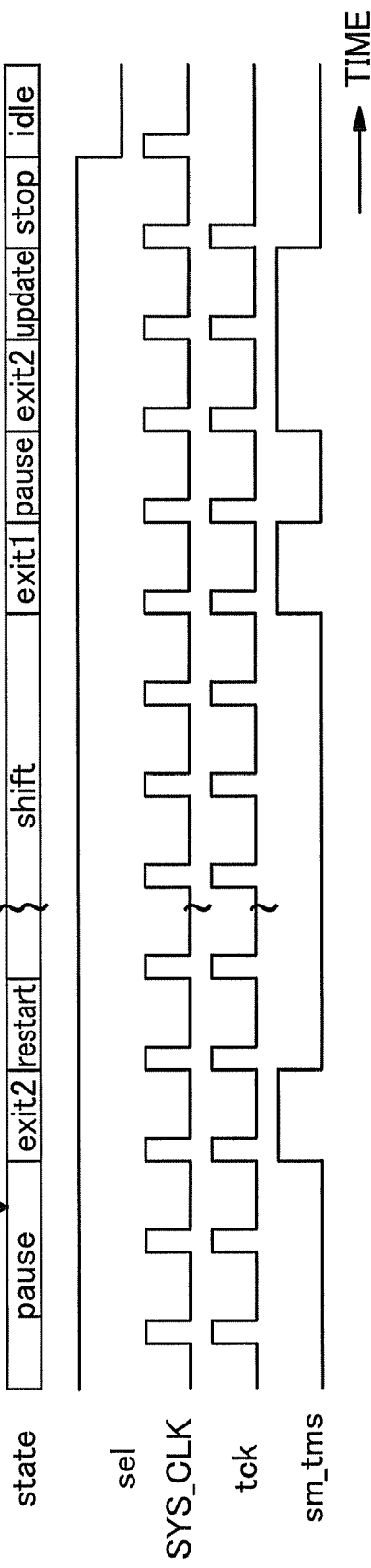

FIG. 11 is a timing chart for describing the operation of the sequencer 57 in restart mode "restart". Referring to FIG. 11, the timing (A) is followed by the timing (B). The downward thick arrow illustrated in FIG. 11(A) indicates the start of the register 55 by using the clock and serial data SMBus_IF from the SMBus 17, and the downward thick arrow illustrated in FIG. 11(B) indicates the restart of the register 55 by using the clock and serial data SMBus_IF from the SMBus 17.

Meanwhile, when operating mode "mode" is test reset mode trst set in operation S16, the TAPC and peripheral circuits for test are reset. In operation S17, whether or not the test is in off mode "off" is determined. If it is determined NO, the operation returns to S16. If it is determined YES, the operation proceeds to operation S19. When operating mode "mode" is manual reset mode mrst set in operation S18, the state machine in the TAPC is manually reset and the operation proceeds to operation S19. The manual resetting is specified via the SMBus 17. In stop mode stop set in operation S19, the operation of the sequencer 57 is stopped and the operation returns to S1.

Figure 13:
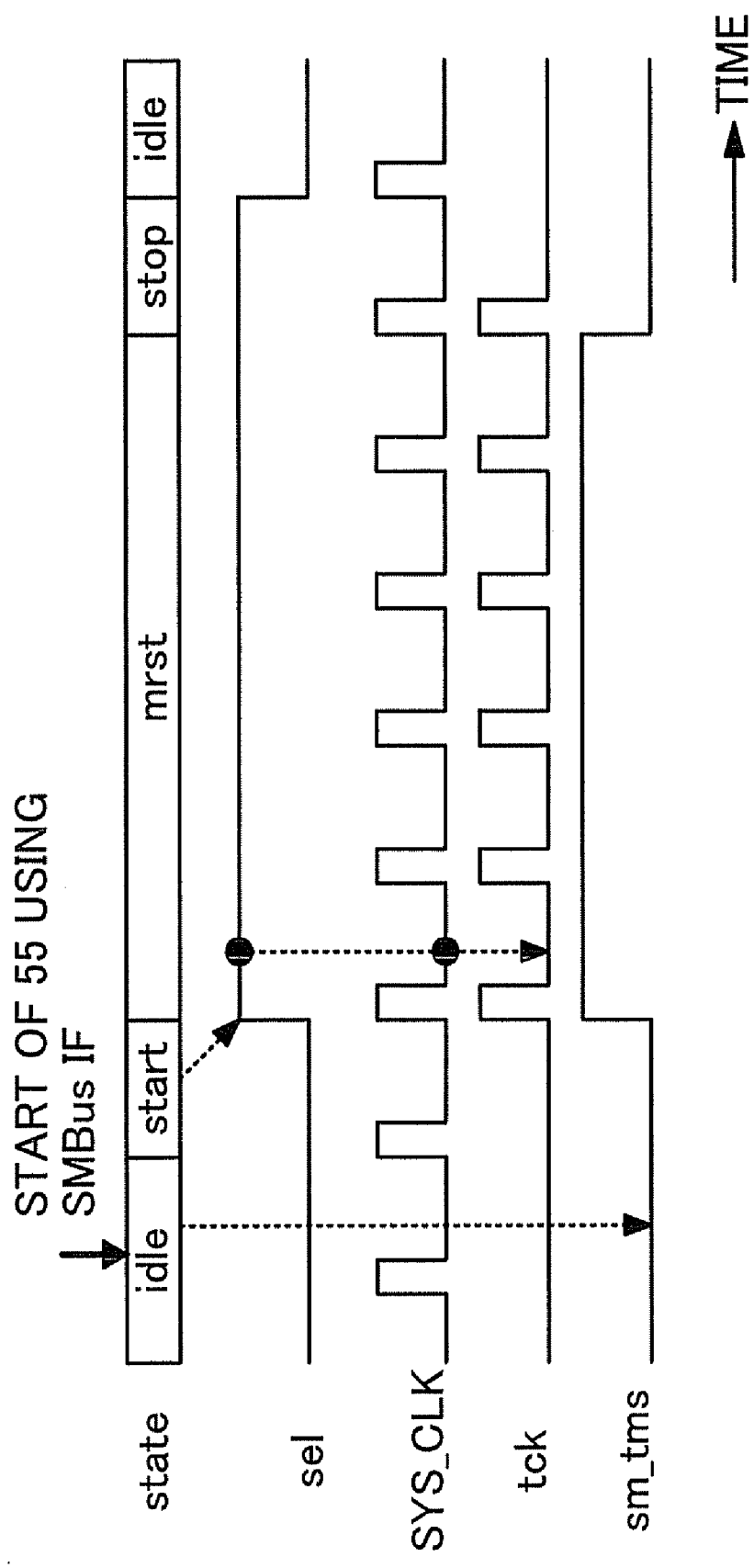
FIG. 13 is a timing chart describing an operation of a sequencer in a manual reset mode.

FIG. 12 is a timing chart describing the operation of the sequencer 57 in test reset mode trst. FIG. 13 is a timing chart describing the operation of the sequencer 57 in manual reset mode mrst. Referring to FIG. 12, the downward thick arrow in the far left side indicates the start of the register 55 by using the clock and serial data SMBus_IF from the SMBus 17. Similarly, the downward thick arrow in the right side indicates stopping of the register 55 by using the clock and serial data SMBus_IF from the SMBus 17. Referring to FIG. 13, the downward thick arrow indicates the start of the register 55 by using the clock and serial data SMBus_IF from the SMBus 17.

As described above, in the TAPC 71, different registers in the LSI device are scanned depending on the IR mode and DR mode. Thus, the scan control circuit 41 is provided with the register 55 for specifying the IR mode or Dr mode. The register 55 can be set via the SMBus 17. The sequencer 57 changes according to the mode set in the register 55, and a sequence to be generated. Further, the scan control circuit 41 is provided with the register 56 for specifying the number of scan shifts. The register 56 can be set via the SMBus 17. The sequencer 57 determines the shift start and shift termination according to the number of shifts set in the register 56 and generates a sequence.

The sequencer 57 generates based on value(s) set in the registers 55 and 56, test mode select signal sm_tms and test reset signal sm_trst. The TAPC 71 determines on the operation based on the change of test mode select signal tms and test reset signal trst and thereby controls scanning. The JTAG bus 18 is used only during testing of the LSI devices 14, 14A, 24 and 24A, and during operation of the apparatus such as the boards 11-1 to 11-4, signal JTAG_IF from the JTAG bus 18 is blocked by the selectors 61 to 63 and not inputted to the TAPC 71.

The scan chain rebuilding unit 72 supplies scan-out data tdoi to the TAPC 71 and cuts scan-in data tdi from the scan control circuit 41, so that connection with the data register 58 is made. The data register 58 is used for setting scan-in data from the SMBus 17 and performing a shift operation during scanning. When the scan-in data is set, system clock SYS_CLK is supplied so that writing can be performed, and during scanning, the supply of system clock SYS_CLK to the data register 58 is stopped, so that the shift operation during scanning is performed in response to scan clock ack, bck.

During operation of the apparatus, the scan control circuit 41 generates test clock tck from system clock SYS_CLK. In view of power consumption of the apparatus, test clock tck is supplied to the TAPC 71 during a period from just after the scan start to the scan stop. When scanning is not performed, the scan control circuit 41 does not supply test clock tck to the TAPC 71.

As the scan modes, there are a manual scan mode in which the setting can be made via the internal controller 54 from the SMBus 17, and an auto scan mode.

In the manual scan mode, necessary registers 55 and 56 are set from the SMBus 17 to execute scanning, and the scanning is started after completion of setting of the registers 55 and 56.

Figure 14:
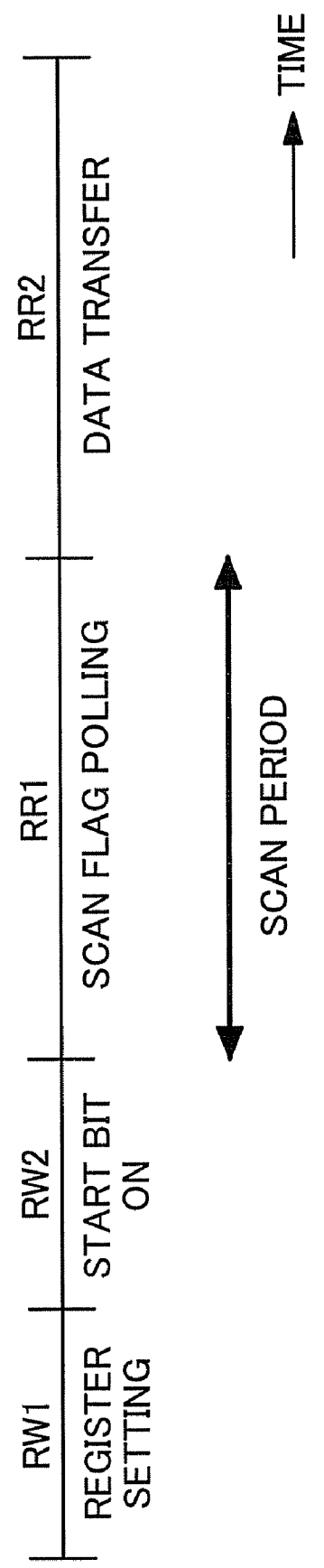
FIG. 14 is a view describing a manual scan mode.

FIG. 14 is a view for describing the manual scan mode. Referring to FIG. 14, "register setting" indicates write period RW1 where the IR mode or DR mode is set in the register 55 and the number of shifts is set in the register 56. "start bit on" indicates write period RW2 where a start bit to be turned on in starting scanning is set in the register 55. "scan flag polling" indicates read period RR1 where polling is performed for scan flag FL managed in the sequencer 57, and when the turnoff of scan flag FL and the completion of scanning are confirmed, the information set in the registers 55 and 56 is collected. "data transfer" indicates read period RR2 where scan data is read and transferred from the data register 58 via the SMBus 17 to the outside. The scan data transferred via the SMBus 17 to the outside corresponds to a log indicating a test result.

Figure 15:
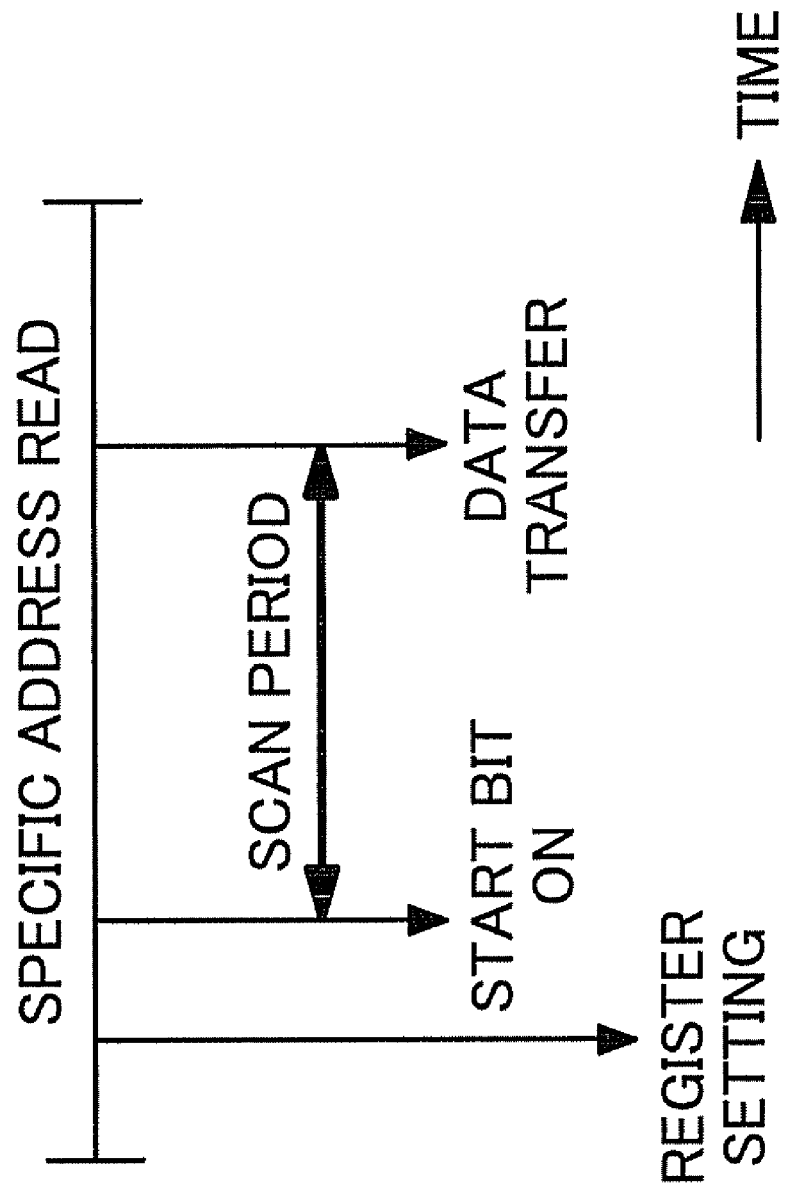
FIG. 15 is a view describing an auto scan mode.

In the auto scan mode, when a read access is made from the SMBus 17 to a specific address corresponding to one scan chain formed by the scan chain rebuilding unit 72 in the LSI device, the internal controller 54 automatically sets a fixed value in the registers 55 and 56 and thereby starts scanning. In the auto scan mode, the operation of reading scan data and transferring the data from the data register 58 via the SMBus 17 to the outside is performed all at once by the internal controller 54, e.g., hardware. FIG. 15 is a view describing an auto scan mode. Referring to FIG. 15, "specific address read" indicates a case where a read access occurs to a specific address in the LSI device, and "register setting", "start bit on" and "data transfer" are, similarly to FIG. 14, automatically performed by the internal controller 54.

Register Write and Register Read for the LSI device via the SMBus 17 are performed using SMBus clock SMBCLK and serial data SMBDT (that is, SMBus_IF) transferred via the SMBus 17. In the register write operation, the setting of IR mode or DR mode in the register 55, the setting of the number of shifts in the register 56, and the setting of a start bit to be turned on in starting scanning in the register 55 are made to start scanning. Meanwhile, in the register read operation, the polling of scan flag FL managed in the sequencer 57 is performed, and when the turnoff of scan flag FL and the completion of scanning are confirmed, the information set in the registers 55 and 56 is read and collected.

Figure 16:
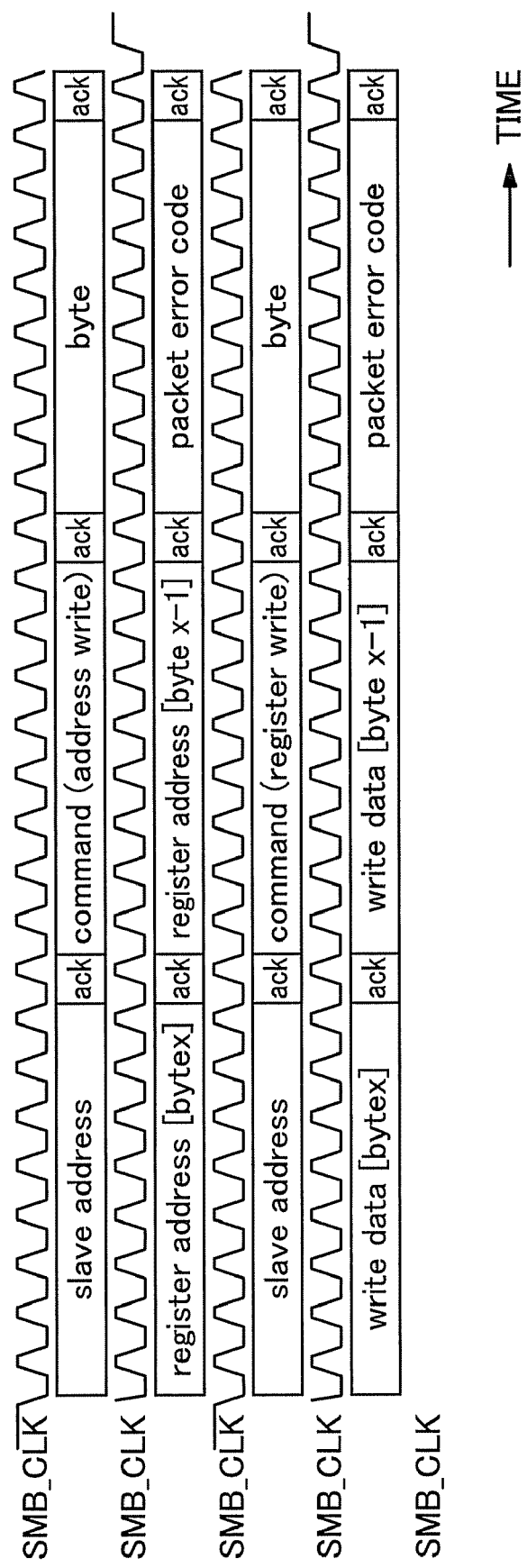
FIG. 16 is a timing chart describing a write operation using SMBus.
Figure 17:
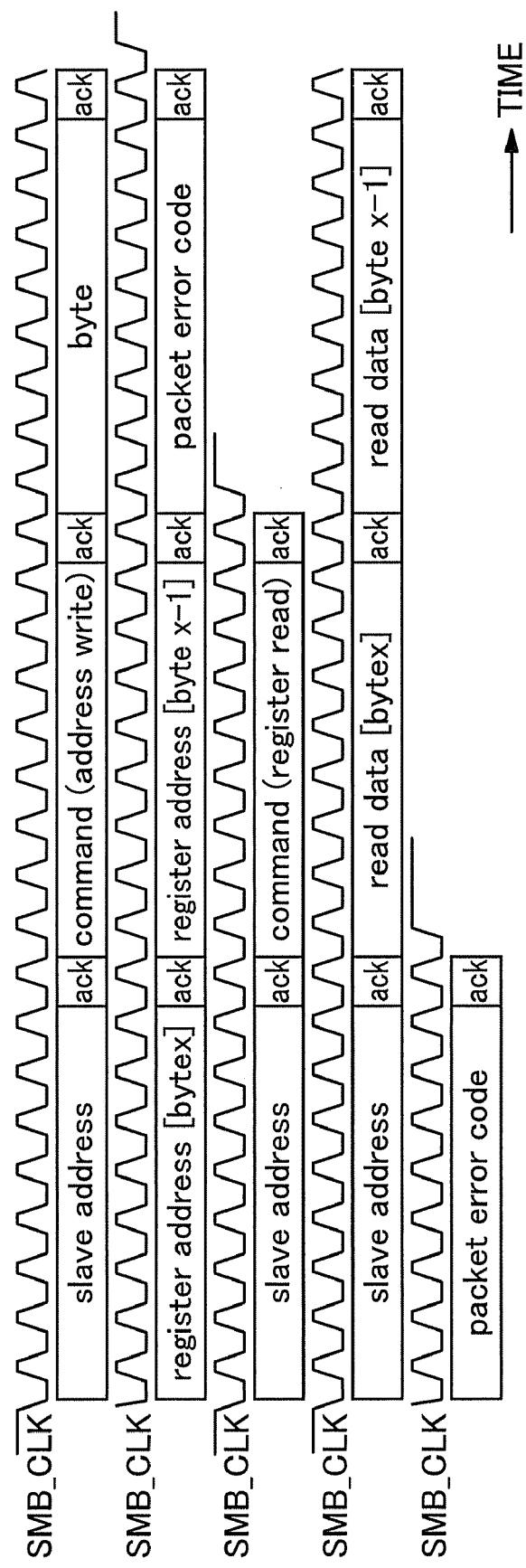
FIG. 17 is a timing chart describing a read operation using SMBus.

FIG. 16 is a timing chart describing a write operation using the SMBus. FIG. 17 is a timing chart describing a read operation using the SMBus. Referring to FIGS. 16 and 17, ack denotes response information or acknowledge information indicating correct reception of address, command, data and the like, and is sent back from the LSI device side.

FIG. 16 illustrates an example in which a slave address, an address write command, a byte, register address of byte x, register address of byte x-1, packet error code, slave address, register write command, byte, write data of byte x, write data of byte x-1 and packet error code are inputted from the SMBus 17 to the scan control circuit 41 to perform a write operation.

FIG. 17 illustrates an example in which a slave address, an address write command, a byte, register address of byte x, register address of byte x-1, packet error code, slave address, register read command, slave address, read data of byte x, read data of byte x-1 and packet error code are inputted from the SMBus 17 to the scan control circuit 41 to perform a read operation.

According to an embodiment, the JTAG bus 18 (JTAG IF) for testing is not used during operation of the apparatus, e.g., during system operation, and the SMBus 17 (SMBus IF) arranged in the apparatus for controlling the apparatus during operation is used to perform scanning during testing of the apparatus, so there is no need to mount a JTAG controller exclusively used for the JTAG bus on the apparatus. Further, there is no need to install on the apparatus, two control programs used for the SMBus controller 15 and JTAG controller. Accordingly, the apparatus configuration can be made less expensive. Further, to perform the control of the whole apparatus, e.g., the system control, only a (single) controller such as the SMBus 17 arranged in the apparatus for controlling the apparatus during operation of the apparatus is used, so the system control is made easier. Consequently, the whole apparatus can be more simply controlled.

The bus for testing is not limited to the JTAG bus. The bus arranged in the apparatus for controlling the apparatus during operation of the apparatus is not limited to the SMBus and I2C bus, with any bus allowing setting in the registers 55 and 56 illustrated in FIG. 6, the scan function can be, as described above, effectively used. Further, while specific configurations of the bus(es), selector(s) and other component(s) are illustrated, the present invention is not limited to implementation using particular elements. For example, any or part of the operations discussed herein may be implemented using hardware and software based configuration.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A scan control method for a circuit device connected with a first bus and having a test access port controller, the method comprising:
   setting information indicating a register to be scanned in the circuit device, a number of scan shifts and a scan start via a second bus different from the first bus; and
   generating, based on said setting of the information, a signal replacing a test mode signal and a test reset signal transferred via the first bus during testing of the circuit device, and supplying the signal to the test access port controller.

2. The scan control method according to claim 1, comprising:
   setting scan-in data via the second bus in a data register, and wherein the scan-in data set in the data register is shifted by the number of shifts set in the register unit.

3. The scan control method according to claim 2, comprising:
   cutting an output of scan-out data to the test access port controller and an input of the scan-in data to the test access port controller, so that a connection with the data register is made and a scan register unit in the circuit device and the data register form one scan chain, thereby accomplishing scan-in and scan-out operation.

4. A scan control circuit for a circuit device connected with a first bus and having a test access port controller, the circuit comprising:
   a register unit in which information indicating a register to be scanned in the circuit device, the number of scan shifts and a scan start is set via a second bus different from the first bus; and
   a sequencer that generates, based on the information set in the register unit, a signal replacing a test mode signal and a test reset signal transferred via the first bus during testing of the circuit device, and supplies the signal to the test access port controller.

5. The scan control circuit according to claim 4, comprising:
   a data register in which scan-in data can be set via the second register, and wherein the scan-in data set in the data register is shifted by the number of shifts set in the register unit.

6. The scan control circuit according to claim 5, wherein a scan chain rebuilding unit in the circuit device cuts an output of scan-out data to the test access port controller and an input of the scan-in data to the test access port controller, so that a connection with the data register is made and a scan register unit in the circuit device and the data register form one scan chain, thereby accomplishing scan-in and scan-out operation.

7. The scan control circuit according to claim 4, comprising:
a controller connected with the second bus and controlling the setting of information in the register unit via the second bus.

8. The scan control circuit according to claim 7, wherein the register unit, the sequencer and the controller are arranged outside of the circuit device, and the scan control circuit and the circuit device are connected via the first bus.

9. The scan control circuit according to claim 7, wherein the register unit, the sequencer and the controller are arranged in the circuit device, and the circuit device is connected with the first and second buses.

10. An apparatus comprising:
a first circuit device connected with a first bus and having a test access port controller;
a second circuit device connected with a second bus different from the first bus;
a bus controller connected with the second bus; and
a scan control circuit connected with the second bus, and wherein the scan control circuit includes:
a register unit in which information indicating a register to be scanned in the first circuit device, a number of scan shifts and a scan start is set via the second bus; and
a sequencer that generates, based on the information set in the register unit, a signal replacing a test mode signal and a test reset signal transferred via the first bus during testing of the first circuit device, and supplies the signal to the test access port controller.

11. The apparatus according to claim 10, wherein the scan control circuit includes a data register in which scan-in data can be set via the second register, and wherein the scan-in data set in the data register is shifted by the number of shifts set in the register unit.

12. The apparatus according to claim 10, wherein a scan chain rebuilding unit in the first circuit device cuts an output of scan-out data to the test access port controller and an input of the scan-in data to the test access port controller, so that a connection with the data register is made and a scan register unit in the first circuit device and the data register form one scan chain, thereby accomplishing scan-in and scan-out operation.

13. The apparatus according to claim 10, wherein the scan control circuit includes a controller connected with the second bus and controlling the setting of information in the register unit via the second bus.

14. The apparatus according to claim 10, wherein the scan control circuit is arranged outside of the first circuit device, and the scan control circuit and the first circuit device are connected via the first bus.

15. The apparatus according to claim 10, wherein the scan control circuit is arranged in the first circuit device, and the first circuit device is connected with the first and second buses.

* * * * *